United States Patent
Lamant et al.

(10) Patent No.: US 9,053,289 B1
(45) Date of Patent: Jun. 9, 2015

(54) METHOD AND SYSTEM FOR IMPLEMENTING AN IMPROVED INTERFACE FOR DESIGNING ELECTRONIC LAYOUTS

(71) Applicant: Cadence Design Systems, Inc., San Jose, CA (US)

(72) Inventors: Gilles S. C. Lamant, Sunnyvale, CA (US); Henry Yu, Palo Alto, CA (US); Simon Simonian, San Jose, CA (US); Johannes Franz Xaver Grad, Pacifica, CA (US); Jeff Taraldson, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/231,632

(22) Filed: Mar. 31, 2014

Related U.S. Application Data

(60) Provisional application No. 61/816,112, filed on Apr. 25, 2013.

(51) Int. Cl.
*G06F 17/50* (2006.01)
*G06F 3/0481* (2013.01)

(52) U.S. Cl.
CPC ........ *G06F 17/5081* (2013.01); *G06F 3/04812* (2013.01)

(58) Field of Classification Search
USPC .................................. 716/118, 119, 126, 139
See application file for complete search history.

(56) References Cited

U.S. PATENT DOCUMENTS

| | | | |
|---|---|---|---|
| 7,328,420 B1 * | 2/2008 | Datta et al. ..................... | 716/102 |
| 7,735,050 B2 | 6/2010 | Yu et al. | |
| 8,028,259 B2 | 9/2011 | Vogel | |
| 8,046,730 B1 | 10/2011 | Ferguson et al. | |
| 8,176,445 B1 | 5/2012 | Qian | |
| 8,381,153 B2 | 2/2013 | Chiang et al. | |
| 8,397,194 B2 | 3/2013 | Uppaluri et al. | |
| 8,453,103 B2 * | 5/2013 | Bendicksen et al. .......... | 716/139 |
| 8,516,404 B1 | 8/2013 | Cao et al. | |
| 8,595,662 B1 | 11/2013 | Yu et al. | |
| 8,645,902 B1 | 2/2014 | Yu et al. | |
| 8,694,943 B1 | 4/2014 | Yu et al. | |
| 8,726,204 B2 | 5/2014 | Yu et al. | |
| 2003/0229860 A1 | 12/2003 | Li | |
| 2004/0068708 A1 | 4/2004 | Sivaraman et al. | |

(Continued)

OTHER PUBLICATIONS

U.S. Appl. No. 13/445,860, filed on Apr. 12, 2012.

*Primary Examiner* — Brian Ngo
(74) *Attorney, Agent, or Firm* — Vista IP Law Group, LLP

(57) ABSTRACT

Disclosed is a method and system for visualizing legal locations of edges and dimensions for an object being placed or edited in the layout. During the design process, visual indicators may be provided to the user to indicate the legal locations at which edges of an object may be placed in the layout. Gravitation and/or snapping may be provided automatically identify and/or move the edges to the legal locations. However, the user can control whether and under what circumstances the gravitation and/or snapping will occur. In this way, the designer does not need to manually place the edges of every single object, which is especially helpful for objects that are intended to have an edge at a legal location. Upon a design choice by the designer, the objects can be edited so that an edge does not need to immediately comply with a design rule.

30 Claims, 15 Drawing Sheets

(56) References Cited

U.S. PATENT DOCUMENTS

| | | |
|---|---|---|
| 2005/0221201 A1 | 10/2005 | Ellis |
| 2005/0268258 A1 | 12/2005 | Decker |
| 2006/0200789 A1 | 9/2006 | Rittman |
| 2006/0259882 A1 | 11/2006 | Lin et al. |
| 2007/0148794 A1 | 6/2007 | Chaetal et al. |
| 2008/0005713 A1 | 1/2008 | Singh et al. |
| 2008/0178140 A1 | 7/2008 | Lin et al. |
| 2008/0184183 A1 | 7/2008 | Kobayashi |
| 2008/0250361 A1 | 10/2008 | Bae et al. |
| 2009/0037852 A1 | 2/2009 | Kobayashi et al. |
| 2009/0083689 A1 | 3/2009 | Ringe et al. |
| 2009/0150850 A1 | 6/2009 | Sinha et al. |
| 2009/0172624 A1 | 7/2009 | Lamant |
| 2009/0254814 A1 | 10/2009 | Lai et al. |
| 2009/0276735 A1 | 11/2009 | Kramer et al. |
| 2009/0313596 A1 | 12/2009 | Lippmann et al. |
| 2010/0004902 A1 | 1/2010 | Lamant |
| 2010/0115207 A1 | 5/2010 | Arora et al. |
| 2010/0162151 A1 | 6/2010 | Class et al. |
| 2010/0205575 A1* | 8/2010 | Arora et al. ............ 716/11 |
| 2010/0229140 A1 | 9/2010 | Strolenberg et al. |
| 2010/0257498 A1 | 10/2010 | Alpert et al. |
| 2011/0066995 A1 | 3/2011 | Arsintescu et al. |
| 2011/0099530 A1 | 4/2011 | Lamant |
| 2011/0219341 A1 | 9/2011 | Cao et al. |
| 2012/0023468 A1 | 1/2012 | Fischer et al. |
| 2012/0023470 A1 | 1/2012 | Nakagawa |
| 2012/0023471 A1 | 1/2012 | Fischer et al. |
| 2012/0030644 A1 | 2/2012 | Lamant |
| 2012/0185811 A1 | 7/2012 | Ramachandran et al. |
| 2012/0254818 A1 | 10/2012 | Liu et al. |
| 2013/0031521 A1 | 1/2013 | Teoh |
| 2013/0086542 A1 | 4/2013 | Teoh et al. |

\* cited by examiner

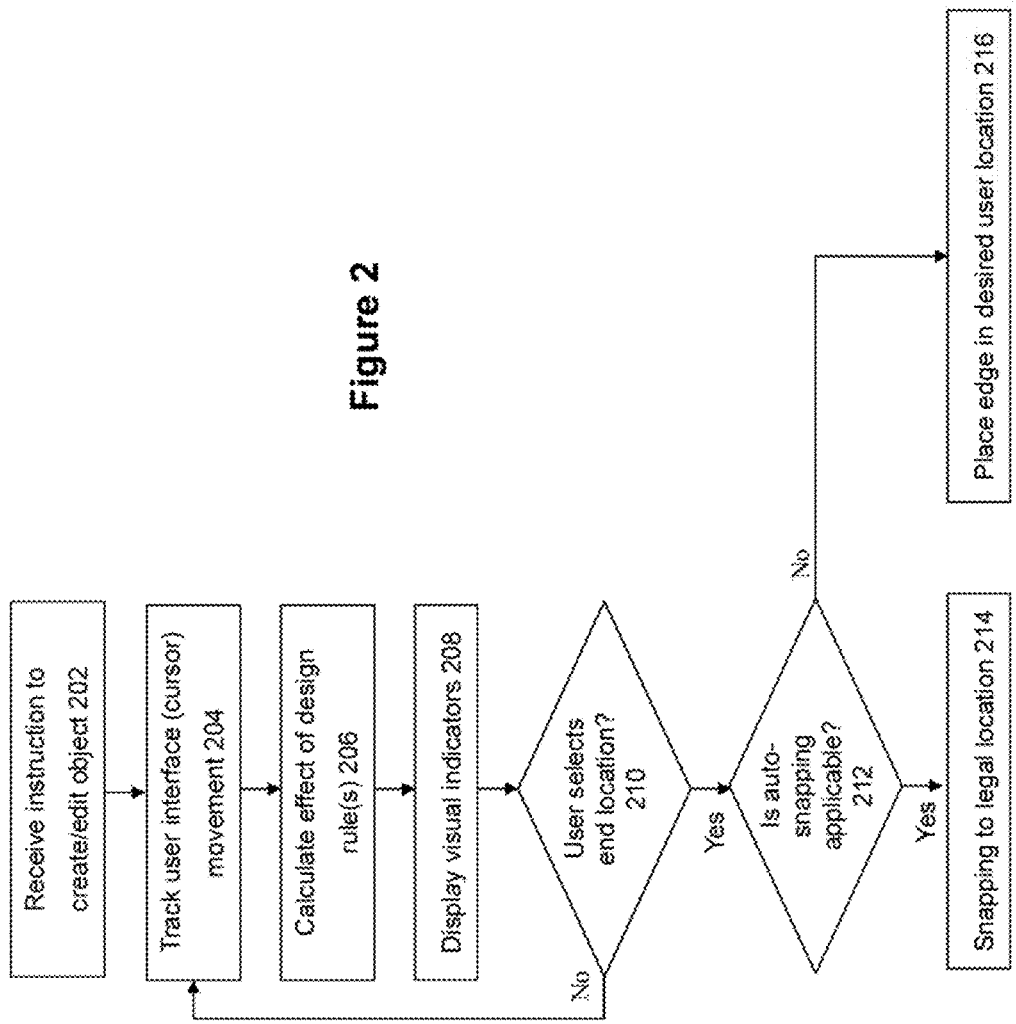

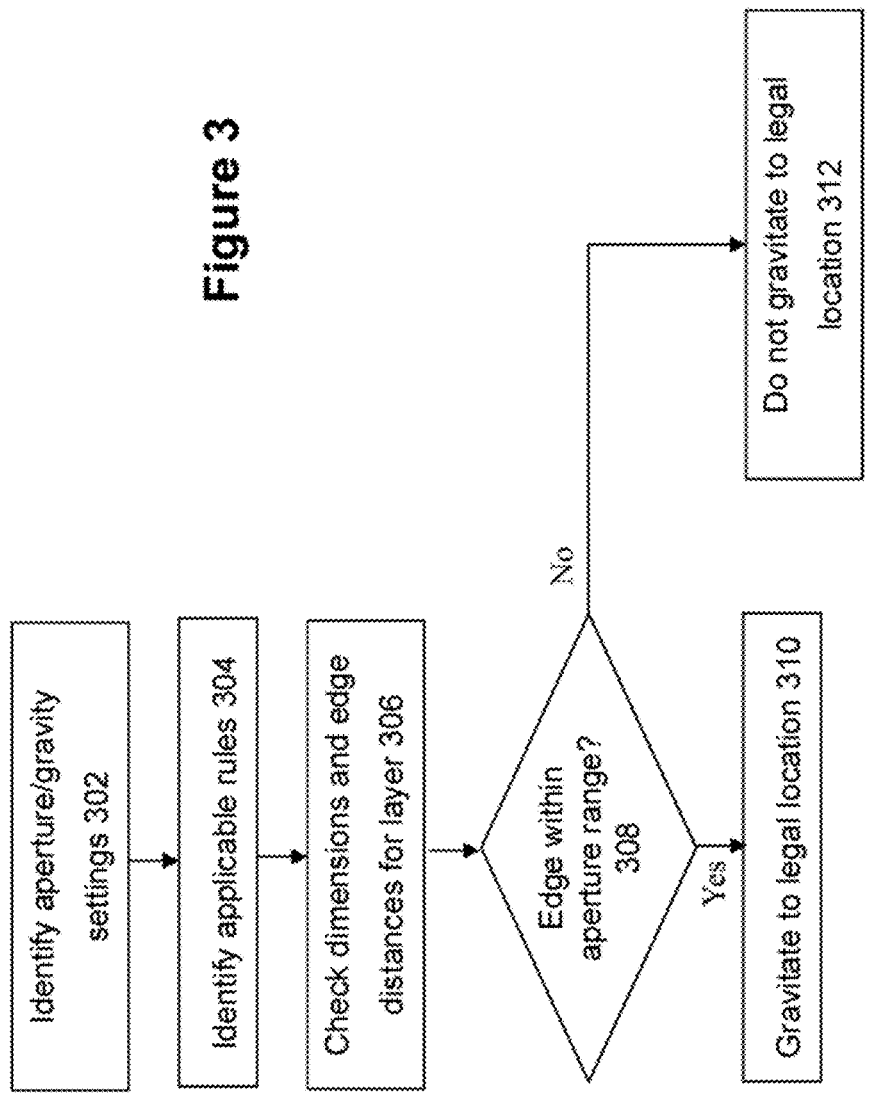

METHOD AND SYSTEM FOR IMPLEMENTING AN IMPROVED INTERFACE FOR DESIGNING ELECTRONIC LAYOUTS

CROSS-REFERENCE TO RELATED APPLICATIONS

The present application claims the benefit of priority to U.S. Provisional Application 61/816,112, filed on Apr. 25, 2013, entitled "METHOD AND SYSTEM FOR IMPLEMENTING AN IMPROVED INTERFACE FOR DESIGNING ELECTRONIC LAYOUTS". The present application is also related to U.S. patent application Ser. No. 13/445,832, filed on Apr. 12, 2012, entitled "METHODS, SYSTEMS, AND ARTICLES OF MANUFACTURE FOR IMPLEMENTING A PHYSICAL DESIGN OF AN ELECTRONIC CIRCUIT WITH AUTOMATIC SNAPPING", U.S. patent application Ser. No. 13/445,847, filed on Apr. 12, 2012, entitled "METHODS, SYSTEMS, AND COMPUTER PROGRAM PRODUCTS FOR IMPLEMENTING INTERACTIVE COLORING OF PHYSICAL DESIGN COMPONENTS IN A PHYSICAL ELECTRONIC DESIGN WITH MULTIPLE-PATTERNING TECHNIQUES AWARENESS", U.S. patent application Ser. No. 13/445,860, filed on Apr. 12, 2012, entitled "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", and U.S. patent application Ser. No. 13/445,874, filed on Apr. 12, 2012, entitled "METHODS, SYSTEMS, AND COMPUTER PROGRAM PRODUCT FOR IMPLEMENTING ELECTRONIC DESIGNS WITH CONNECTIVITY AND CONSTRAINT AWARENESS". The above applications are all hereby incorporated by reference in their entirety.

FIELD

The invention relates to the implementation of electronic designs, such as the design of Integrated Circuits (ICs).

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

A layout file is created from the placement and routing process, which assigns logic cells to physical locations in the device layout and routes their interconnections. The physical layout is typically described as many patterned layers, and the pattern of each layer is described by the union of a set of polygons. Component devices and interconnections of the integrated circuit are constructed layer by layer. A layer is deposited on the wafer and then it is patterned using a photolithography process and an etch process.

One or more photomasks are created from the layout file for the photolithography of each layer. Photomasks are used to transfer the layout pattern onto the physical layer on the wafer. A photomask, or mask, provides an image of the desired physical geometries of the respective integrated circuit layer. Passing light through the mask projects the layout pattern for the layer onto the wafer. An imaging lens system projects and focuses the layout onto the substrate. The projected light pattern interacts with a photosensitive resist coating on the wafer and, resist portions that are exposed to light are rendered either soluble or insoluble in a developer solution, depending on the type of the photoresist. Accordingly, the mask pattern is transferred into the photo-resist by optical projection and chemical reactions. The photo-resist pattern is subsequently transferred to an underlying layer by an etch process. Most commonly, plasma containing chemically-selective reactive ions is used to etch high-aspect ratio trenches and holes with close to vertical sidewalls.

With a continuing desire to provide greater functionality in smaller packages and the evolution of processing technologies, IC feature geometries are being driven to smaller and smaller dimensions. However, the ability to project an accurate image of increasingly smaller features onto the wafer is increasingly limited by the inherent limitations of conventional semiconductor manufacturing processes. To address these inherent difficulties when manufacturing at extremely small feature sizes, many fabrication facilities now require stringent compliance with many design rules.

For example, with modern manufacturing and processes, design rules may be implemented which allow only certain widths during the creation of shapes on certain layers, e.g., during the creation of FinFET regions in an IC design. These rules restrict the width of an object (e.g., rectangle or polygon) to certain specified width dimensions on the layout. Any deviation from these allowable widths would constitute a design rule violation.

Various approaches can be taken by a designer to comply with such rules. One possible approach is to provide "snapping" in a layout editing/creation tool, where objects inserted into a layout are automatically moved to a legal dimension for the object. The problem with this approach is that in some cases, a designer may wish to have the flexibility to insert an object that does not currently meet the allowable width rule. However if snapping is turned on, the snapping approach will not allow this to occur.

To illustrate, consider FIG. 1, where portion 102a illustrates how a designer using a custom editing tool may use a user interface to fix a first edge of a rectangle (e.g., by clicking a location in the layout to fix the left side of the rectangle), and then move the cursor to direct the location of a second edge of the rectangle (e.g., in the right-hand direction as shown in the figure). The dashed line indicates the closest legal edge location for the rectangle. Assume that the designer does not wish to place the right-hand edge of the rectangle at that legal location. Instead, as shown in portion 102b, the designer intends for the right-hand edge of the rectangle to be located just short of that location. This may occur, for example, if the designer intends a subsequent action to insert another object that abuts the right-hand side of the rectangle, which would cause the overall combined width to comply with a legal allowable width. However, instead of allowing the designer to make the right-hand edge at the desired location (which is currently invalid), as shown in portion 102c, the system will cause the right-hand edge to automatically snap to the legal edge location. This lack of control given to the designer may create enough frustration such that the designer will eventually turn off the snapping functionality, requiring the designer the thereafter manually ensure and measure edge locations if the intent is to place the edge on a valid location. This manual approach creates many inefficiencies, since even in the cases where the designer intends to place an edge right on a legal location, this will have to be done manually.

As is evident, the dedicated manual approach is inefficient, and is likely to be error-prone, since the designer is more likely to unintentionally place objects with illegal dimensions at illegal locations. However, the automated snapping approach is too constrictive and lacks enough control for the designer.

Therefore, there is a need for an improved approach to facilitate the design of electronic circuits, particularly with respect to placement and editing of objects with regards to allowable dimensions and edge locations.

SUMMARY

Embodiments of the invention provide a method and system for visualizing legal locations of edges and dimensions for an object being placed or edited in the layout. During the design process, visual indicators may be provided to the user to indicate the legal locations at which edges of an object may be placed in the layout. Gravitation may be provided to controllably and automatically snap (or "gravitate") the edges to the legal locations. The invention further provides an approach to control whether and under what circumstances the gravitation and/or snapping will occur. In this way, the designer does not need to manually place the edges of every single object, which is especially helpful for objects that are intended to have an edge at a legal location. However, upon a design choice by the designer, the objects can be created and/or edited so that an edge does not need to immediately comply with a design rule.

Other and additional objects, features, and advantages of the invention are described in the detailed description, figures, and claims.

BRIEF DESCRIPTION OF FIGURES

FIG. 2 shows a high level flowchart of the invention according to certain embodiments.

FIG. 3 shows a more detailed flowchart of an approach to implement embodiments of the invention.

DETAILED DESCRIPTION

Figure 1:
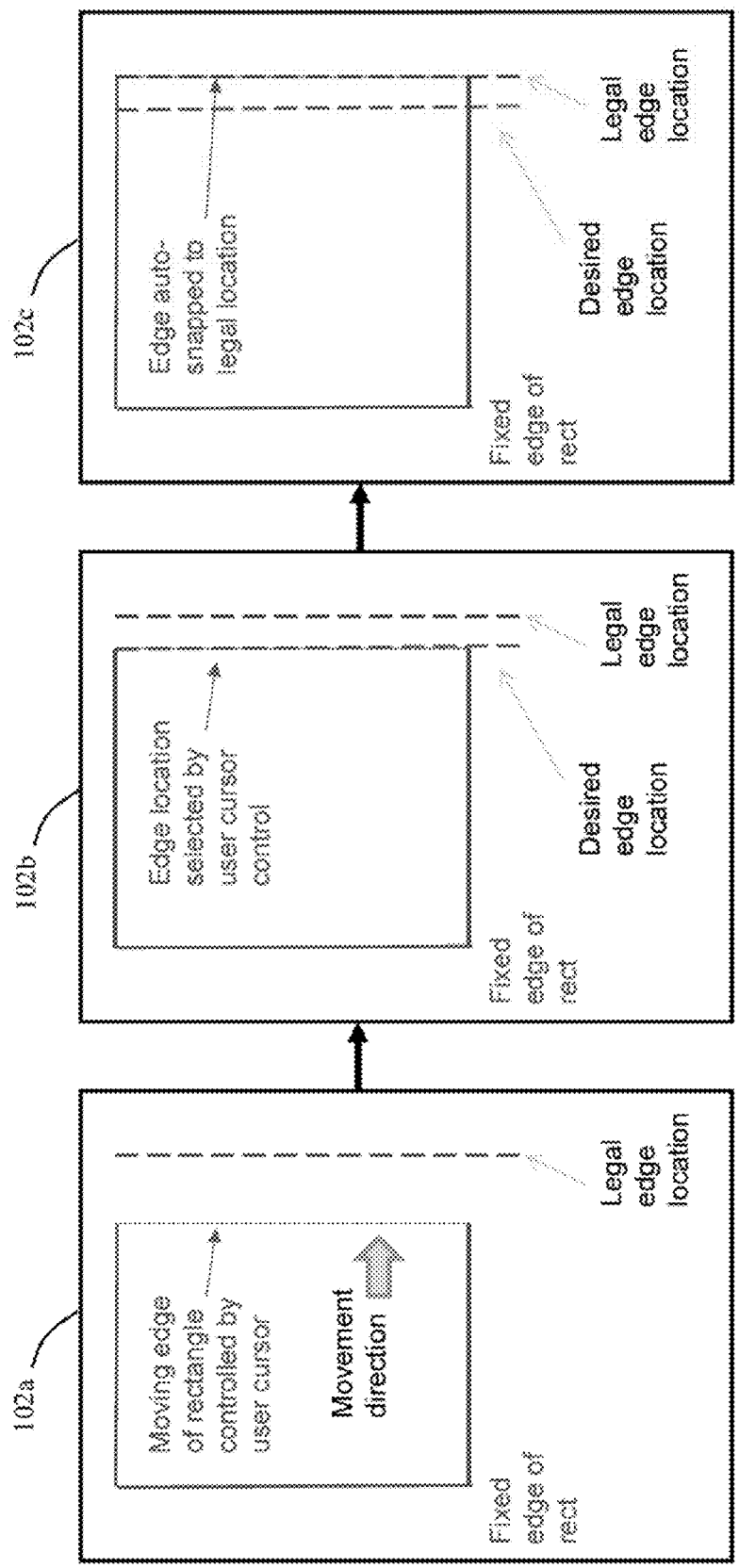
FIG. 1 depicts an example approach to implement a layout.

Modern electronic design and process rules may severely limit the ways that objects can be laid out on a design. As such, users will need additional assistance to avoid creating DRC (design rule check) errors. At the same time, the additional assistance should not be overly intrusive to the ability of the designer to create a design.

Embodiments of the invention provide a method and system for visualizing legal locations of edges and dimensions for an object being placed or edited in the layout. During the design process, visual indicators may be provided to the user to indicate the legal locations at which edges of an object may be placed in the layout. Functionality is provided to automatically gravitate the edges to the legal locations. However, the invention provides an approach to control whether and under what circumstances the gravitation of the edges will occur. In this way, the designer does not need to manually place the edges of every single object, which is especially helpful for objects that are intended to have an edge at a legal location. Upon a design choice by the designer, the objects can be edited so that an edge does not need to immediately comply with a design rule.

As noted above, in modern electronic designs with certain manufacturing processes, only certain widths may be allowed during the creation of shapes on certain layers. This type of constraint may exist, for example, with respect to FinFET regions on an electrical design. Aspects of the invention may be illustratively explained herein in the context of these types of allowable width constraints and with respect to FinFET designs. It is noted, however, that the invention is not limited only to these types of constraints and designs, and may be applicable to other type of constraints and design types as well.

FIG. 2 shows a high level flowchart of the invention according to certain embodiments. At 202, instructions are received to create and/or edit an object. Such instructions include, for example, commands to create rectangle or polygon, commands to stretch a rectangle or polygon, and/or commands pertaining to creation/stretching of objects belonging to islands.

At 204, tracking is performed upon actions taken by the user using a user interface. The user may use a mouse or other pointing device to move a cursor to indicate the positions of various portions of the object being created and/or edited. For example, the user may perform a first mouse click to set the original point/edge of the object, and thereafter move the cursor to direct the system to visually shift another portion/edge of the object.

Therefore, as the user moves the cursor, the possible "drop" location of the other edge of the object also correspondingly moves in the layout. Each of these possible locations for the object edge is impacted by the existence of applicable design rules. Such rules may include constraints upon the allowable width ranges for an object.

For example, consider a constraint for allowable width ranges that is measured either vertically or horizontally, and where the allowable step on a "grid" of permissible edge location is "stepsize a>=b". This type of constraint can be interpreted where the vertical/horizontal dimension of for the layer in question should be at least b (user units), and where incremental widths of a (above b) are allowed. Example of these allowed vertical widths include the following:

b
b+1×a=b+a
b+2×a=b+2a
b+3×a=b+3a

As another example, consider a constraint where the allowed width ranges for "Poly" layers are measured horizontally for (x1 x2 x3 x4 x5 x6 x7 ">=x") and the allowed width ranges for the "Poly" layer measured vertically are (">=y"). This constraint can be interpreted as follows:

The horizontal dimension can be either one of the discrete values x1, x2, x3, x4, x5, x6, x7, or any other value greater or equal to x The vertical dimension can be any value greater or equal to y At 206, the effects of the applicable rules/constraints (hereinafter collectively referred to as constraints) are considered in light of the user interface actions by the user. As described in more detail below, the effects of the user's actions in the interface are analyzed to the dimensions of the object, and those effects are calculated relative to the constraints. Legal locations and/or dimensions for the object edge will be calculated and identified.

At 208, visual indicators are provided to the user in the user interface pertaining to the constraints. The general idea is that when the cursor reaches a certain distance from a legal placement location for an edge, the cursor in the user interface will be snapped to the location that is a legal location. This distance is referred to herein as the "aperture" distance (which may be also referred to herein as "aperture range", "aperture window", or just "aperture"). This approach therefore provides a helpful visual indicator to the user reflected by gravitation of the ghosted edge to the correct valid/legal location for that edge. Even if the cursor is still being moved, the cursor location will not visually change from that legal location while the cursor is within the aperture range. However, when the cursor is not within the aperture distance, then the visual location of the cursor on the user interface is not snapped to the legal location and instead moves correspondingly to the movement of the cursor. In addition, in the situation where the cursor is currently within an aperture range (and thus movement of the cursor does not cause the visual location of the cursor to change), and if the cursor is eventually moved far enough along such that the cursor leaves the aperture range, then the visual cursor location on the user interface will jump to that location and will thereafter move correspondingly to the movement of the cursor (at least until it enters another aperture range).

The process continues until the user sets the location for the other edge of the object (which is checked at 210). A determination is then made at 212 whether auto-snapping should occur. This determination is made because auto-snapping is not performed for all user actions. Instead, auto-snapping can be configurably performed only for certain circumstances. For example, if the user sets the location for the edge while within the aperture range, then the edge of the object will snap to the legal location that is currently being displayed (214). On the other hand, if the cursor is not currently within the aperture range of a legal location, then the object edge will be placed at the exact location indicted by the user (216).

FIG. 3 shows a flowchart of an approach to implement this aspect of embodiments of the invention. At 302, aperture and/or gravity setting are identified for the process. The gravity setting (also referred to herein as a "magnet effect") configures gravitation to a location (e.g., an identified valid or legal location) for a given constraint. The aperture is configured to set the range at which gravitation will occur for objects. The aperture should be set large enough such that it assists the user with editing/creating objects at normal levels. However, the aperture should be small enough to allow the user to have sufficient control over placement of objects that are not intended to move to the legal locations. In some embodiments, the aperture is set to be less than half of the DRC allowable width range distance, e.g., if the allowable width range 10 nanometers, then the aperture can be set at less than 5 nanometers (e.g., at 3 nanometers).

At 304, the applicable rule(s) are identified. For example, as described above, the applicable rules may pertain to allowable width range constraints for objects on certain layers of the design.

At 306, dimensions and edge distances are checked with regards to one or more objects in the layout. This may happen in response to actions taken by a user using an interactive editing tool, e.g., based upon movement of a cursor by the user. In some embodiments, this analysis occurs by constructing a data model of the layout, for example by performing a Boolean operation (e.g., the Boolean OR operation) of the shapes in the layout, where movement of the cursor causes a callback to the function for constructing this data model. Distances are checked between the objects in the structure. In addition, the grid of allowable edge locations can be identified relative to the edges on the layout.

If the cursor reaches an aperture range (identified at 308), then a determination is made of the correct location for the object edge within that window. This may occur in both, or either, of the vertical and horizontal directions. The information is visually presented to the user using one or more visual cues, such as by using different colorations (e.g., with different colors for valid/legal and invalid/illegal locations), changes in visual cursor behavior, and/or by presenting visual artifacts (such as additional colored lines) that indicate the valid locations. In addition, while the cursor is within the aperture range, the user interface can visually lock in the shape of the object with a ghosted image for the valid object dimensions/edge.

If the user moves the cursor within the aperture range, then at 310, gravitation occurs relative to that valid and/or legal location. However, if the edge location is not within the aperture range, then at 312, the object edge does not gravitate to the nearby valid/legal location.

This approach therefore provide for configurable gravitation (configuring the gravity and/or aperture range), which greatly facilitates user editing of objects when the user intends to configure an edge to a valid location. However, the approach also allows the user to exactly set an object edge/ dimension, even at locations that are not currently valid. The ability to set the aperture to configure this functionality makes this approach non-obtrusive to the user for times when snapping is not desired, and yet greatly increases design efficiencies for times when snapping is desired.

Figure 4A:
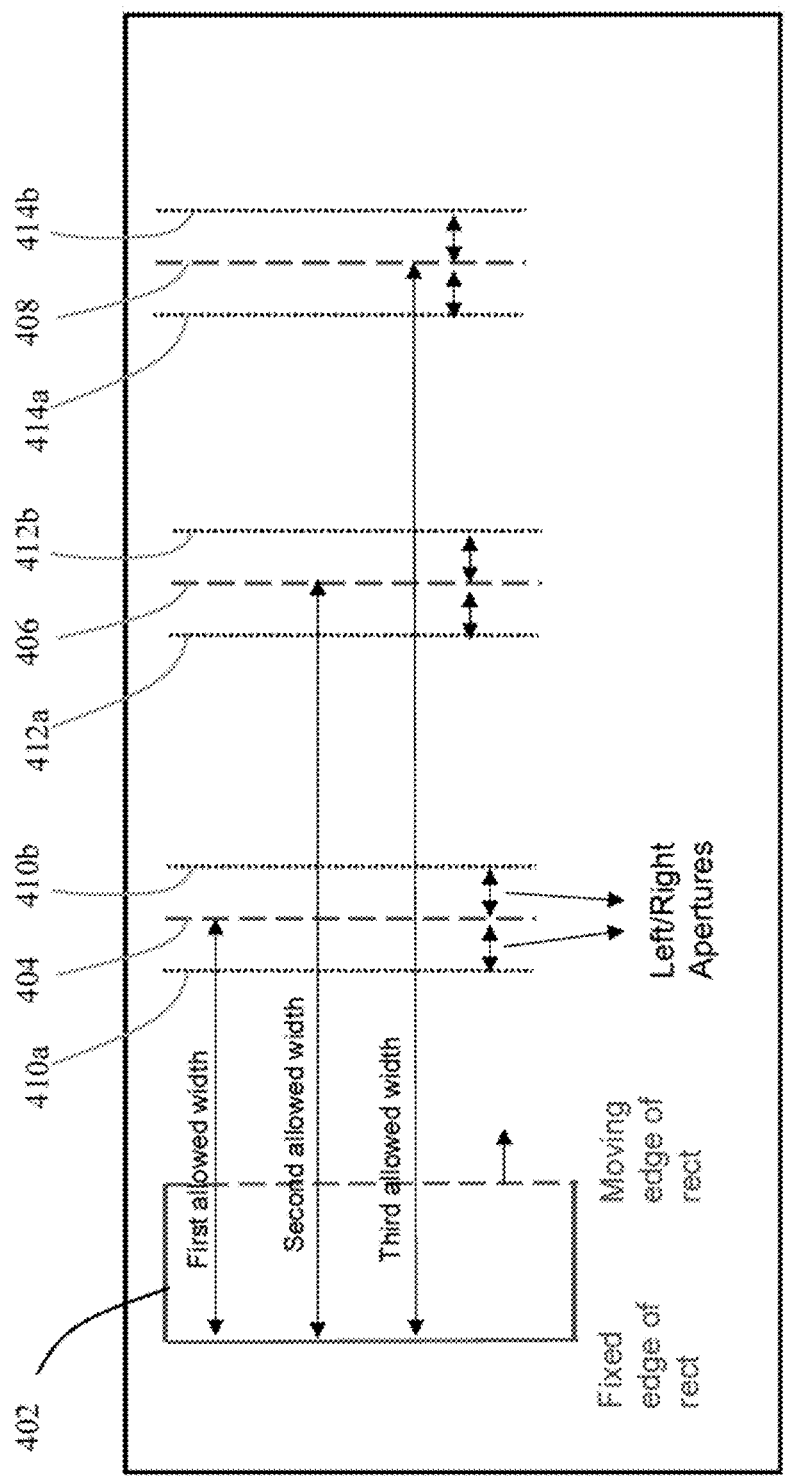
FIG. 4A-C provide illustrations of the invention according to some embodiments.
Figure 4B:
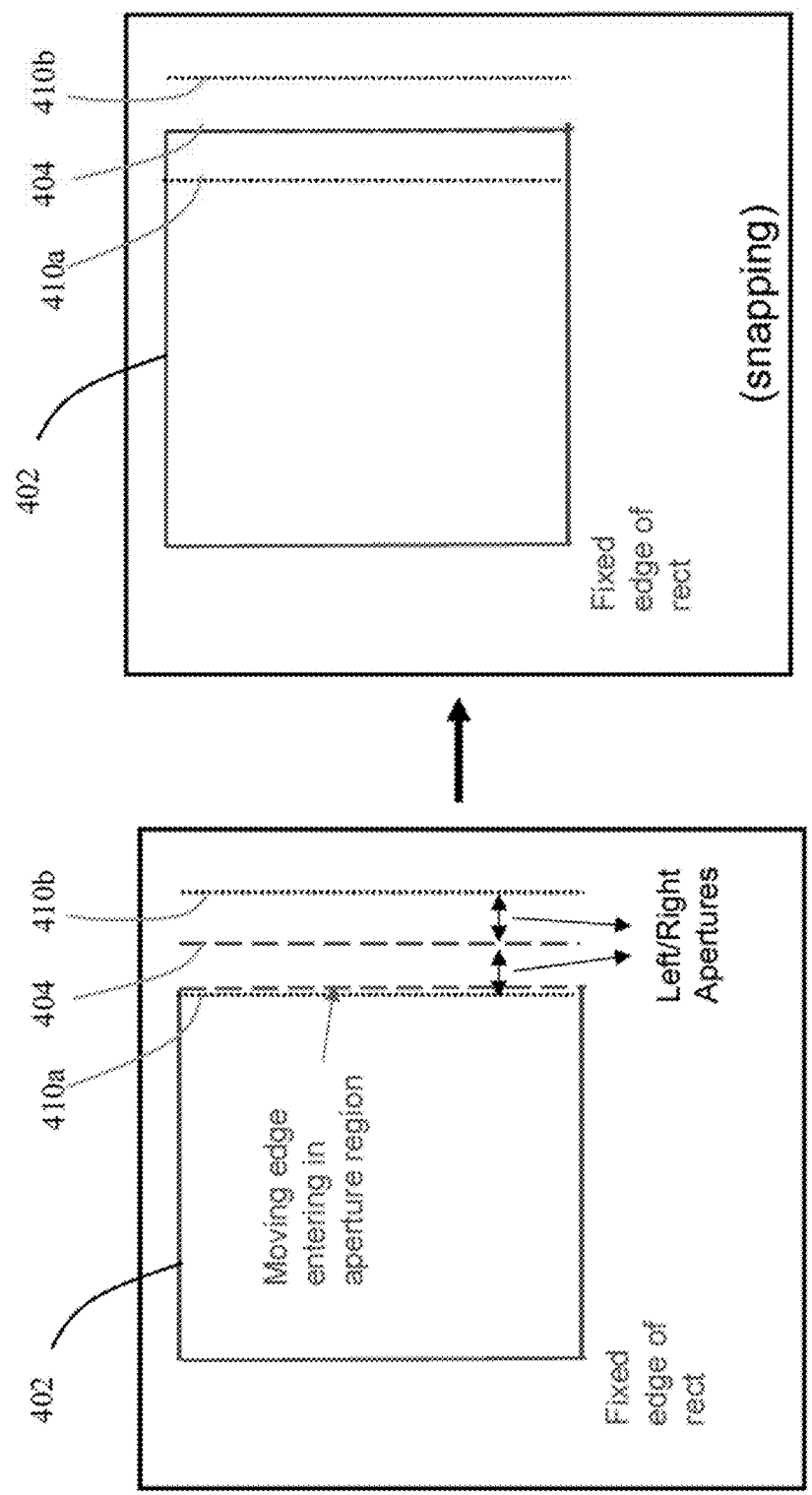
Figure 4C:
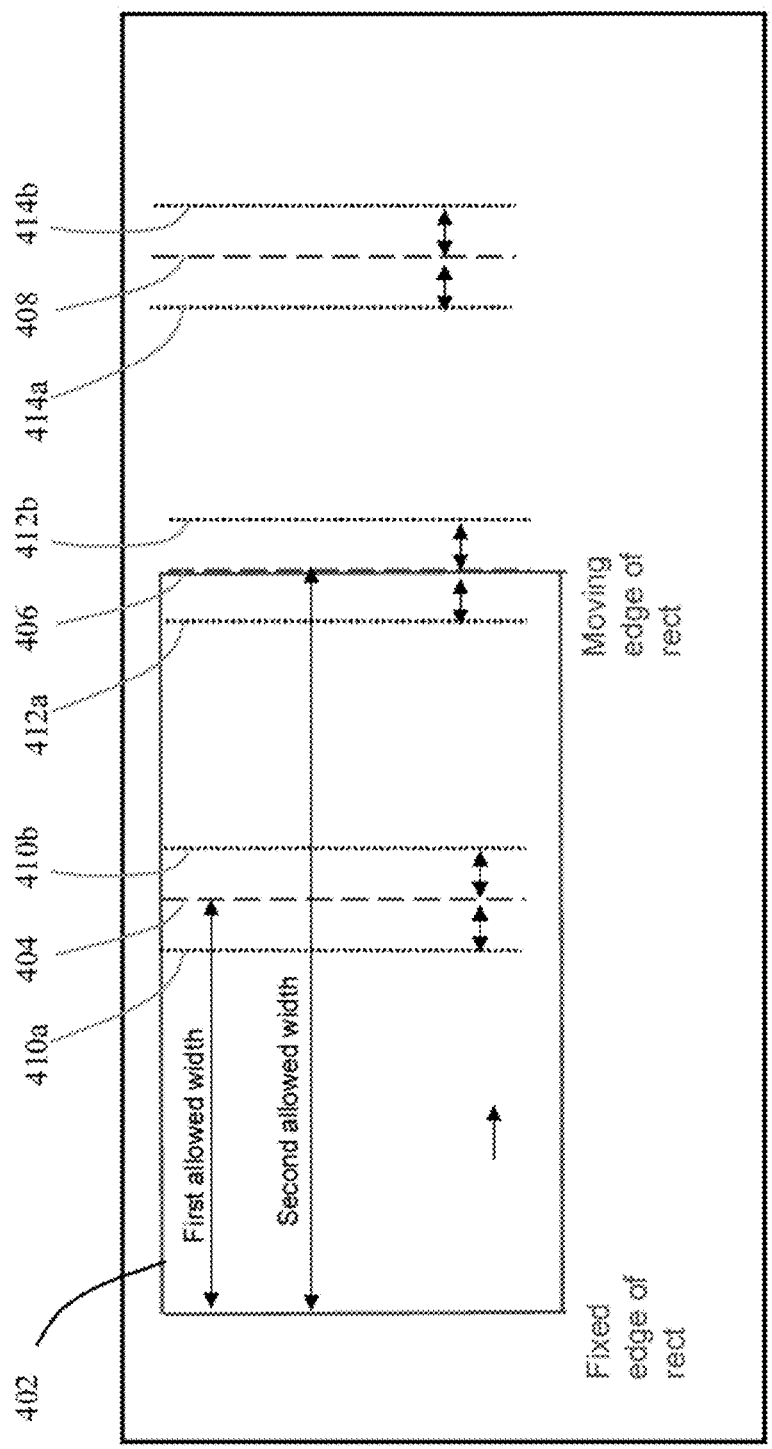

FIG. 4A-C provide illustrations of the invention according to some embodiments. In FIG. 4A, the shape 402 on the left side of the figure is a rectangle being created or stretched. The dashed lines 404, 406, and 408 represent the boundaries for the allowed widths. Here, the dashed line 404 represents a first allowable width, dashed line 406 represents a second allowable width, and dashed line 408 represents a third allowable width. The dotted vertical lines around the dashed lines represent the aperture around these width boundaries. Dotted vertical lines 410a and 410b around the dashed line 404 represent the aperture around the first allowed width boundary. Dotted vertical lines 412a and 412b around the dashed line 406 represent the aperture around the second allowed width boundary. Dotted vertical lines 414a and 414b around the dashed line 408 represent the aperture around the third allowed width boundary.

As shown in FIG. 4B, when the moving edge of the rectangle 402 falls into the aperture region (between the dotted lines 410a and 410b), the gravity functionality moves a ghosted view of it to the legal position (the dashed vertical line 404), and snapping to that position can then be performed upon the appropriate user command. With this capability, the layout designer will have easily created a rectangle whose width abides by one of the allowed width values for that layer, without the need to use the ruler, or without having to edit the width of the rectangles through a property editor form. This can result in significant productivity gains by the designer. However, if the designer chooses to locate the edge outside of the aperture region, then the edge will be placed at that location without snapping. This gives the designer flexibility to create designs without being obtrusively required to snap to the nearest legal/valid location.

As shown in FIG. 4C, as the layout designer continues stretching the rectangle 402, and the moving edge of the rectangle falls in the aperture range (between dotted lines 412a and 412b) of the next allowed width range (represented by dashed line 406), gravitation will occur again. Of course, gravitation should also occur when the moving edge of the rectangle enters into the aperture region from right to left (e.g., the rectangle is shrinking in size).

Figure 5:
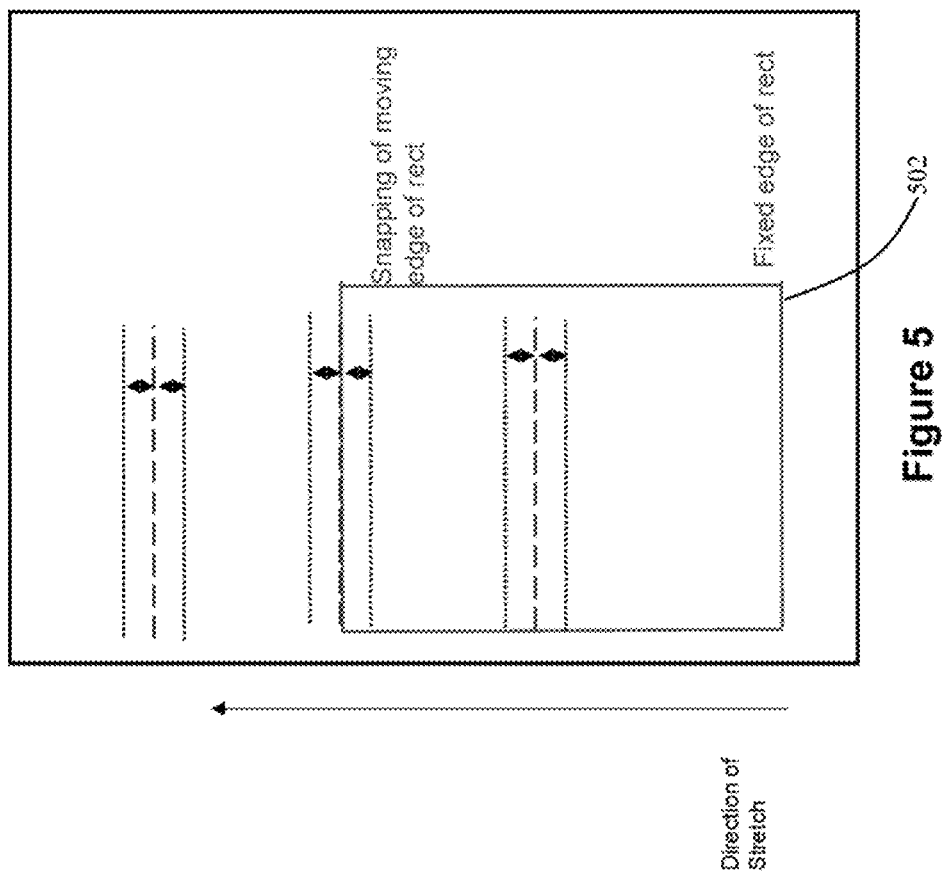
FIG. 5 illustrates an approach for creating/stretching a rectangle in the vertical direction.

The same concepts can be applied in any direction. For example, as shown in FIG. 5, the approach can be applied when creating/stretching the rectangle in the vertical direction. Here, the direction of stretch for the rectangle 502 is in an upwards vertical direction. The same principles described above are applicable to provide gravitation and controllable snapping in this situation as well.

Figure 6:
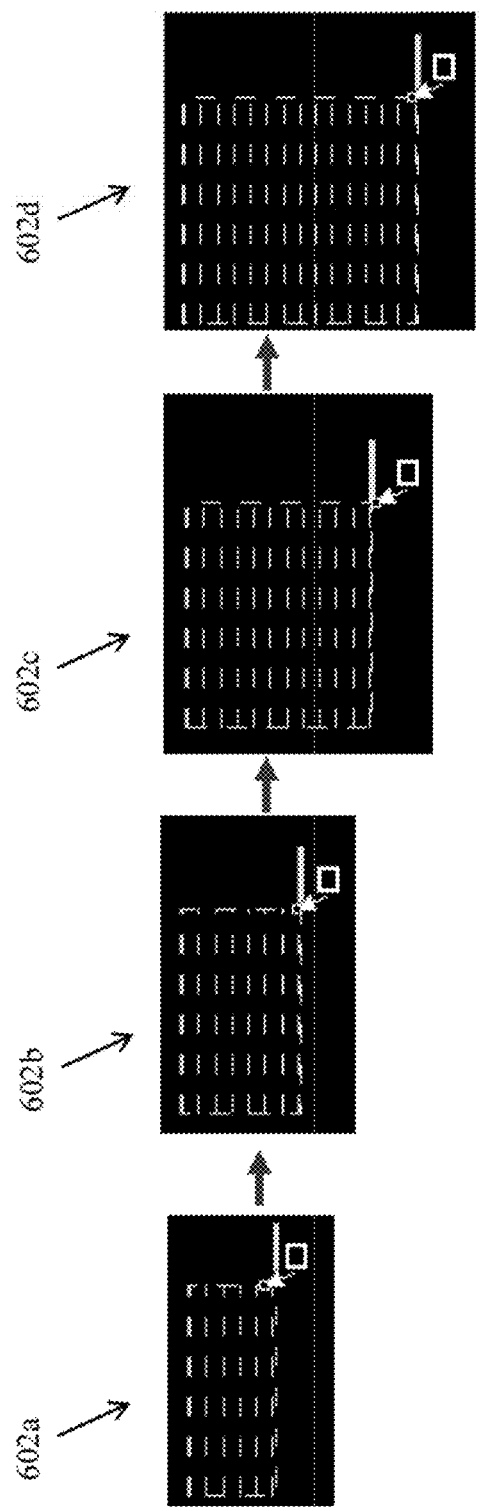
FIG. 6 illustrates an example user interface that shows creation of a rectangle with the gravity/magnet functionality enabled.

FIG. 6 illustrates an example user interface that shows creation of a rectangle with the gravity functionality enabled. In this example, the rectangle is being expanded in the vertical direction only (where the horizontal dimension is not changing). The functionality will make use of the vertical constraint (e.g., and allowed width and/or width-range constraint defined in a technology file). As illustrated in this figure, while the rectangle gets expanded vertically (in the sequence shown from 602a to 602b, from 602b to 602c, and finally from 602c to 602d). If the moving edge of the rectangle falls in the aperture range of an allowed width range, a horizontal colored highlight (e.g., colored line highlights) will be displayed on the canvas, and gravitation occurs at that time. The end result is that the vertical dimension of the rectangle will be compliant to the legal allowed vertical width values defined in the constraint (e.g., DRC correct vertical dimension).

Figure 7:
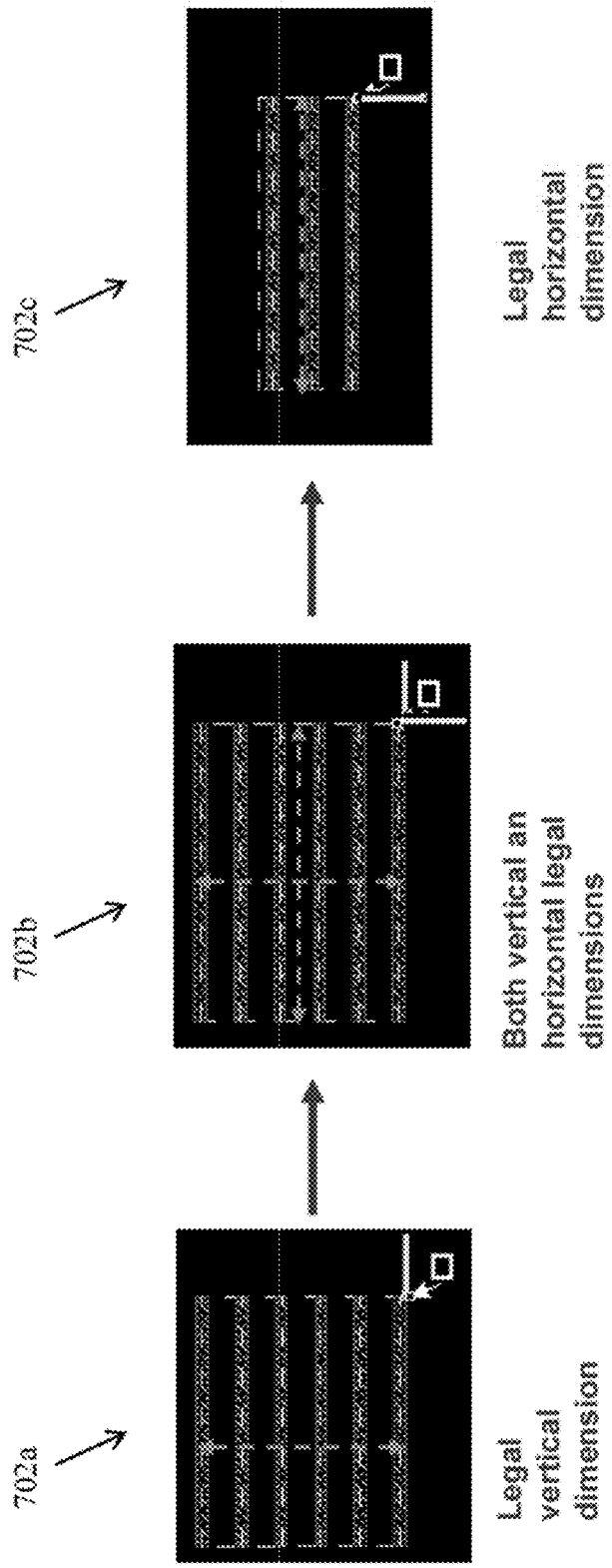
FIG. 7 illustrates an example user interface for creating/editing in multiple directions.

The inventive approach can be applied in multiple directions. For example, as shown in FIG. 7, the user interaction illustrated by sequence 702a-c may cause the cursor to move in a vertical direction, both vertical and horizontal directions, and/or horizontal directions. In this case, horizontal and/or vertical highlights (e.g., yellow colored highlights) are displayed when one or both of the moving edges of the rectangle respectively enter in the aperture range of an allowed vertical or horizontal width range. Here, the horizontal highlight is shown in 702a to indicate the legal vertical dimension, the vertical highlight is shown in 702c to indicate the legal horizontal dimension, and both the horizontal and vertical highlights are shown in 702b to indicate the legal vertical and horizontal dimensions, respectively.

Figure 8:
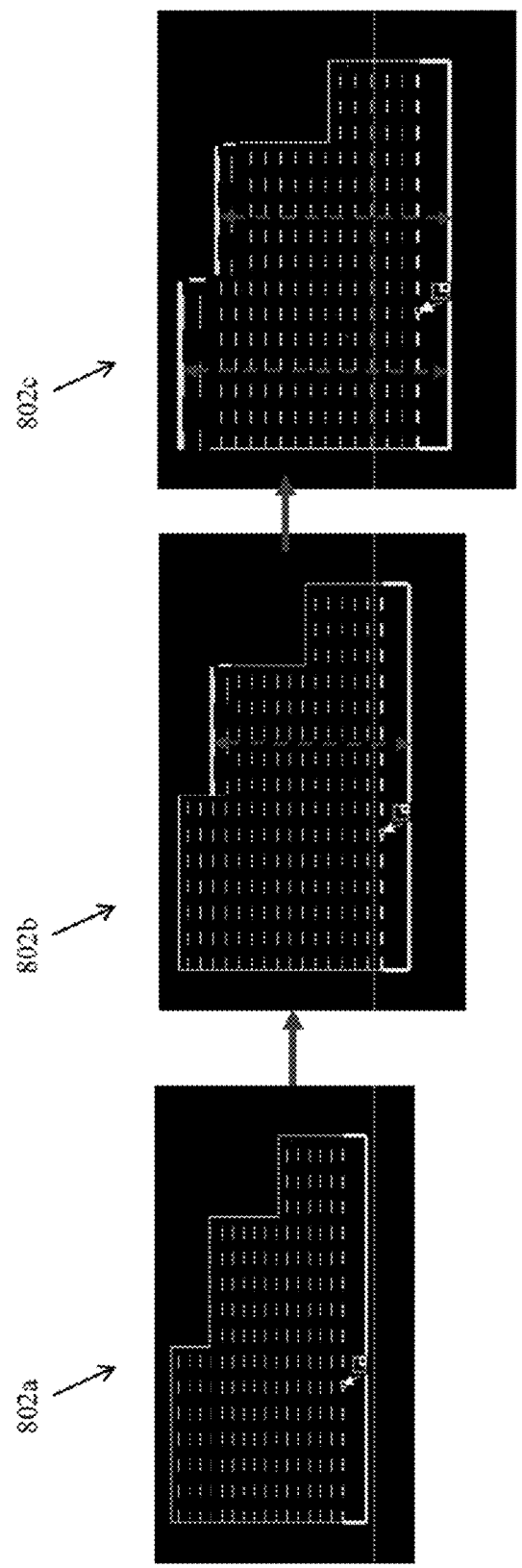
FIG. 8 illustrates an example user interface to create/edit polygons.

The inventive approach can also be applied to create or edit polygons. For example, as shown in FIG. 8, the gravity effects are also available during the creation and/or stretching of polygons. The left-hand portion of the figure at 802a illustrates where the bottom edge of a polygon is being stretched vertically. The middle portion at 802b illustrates when a legal vertical width is reached between the bottom edge and one of the top horizontal edges of the polygon. The right-hand portion at 802c illustrates the effect that takes place as legal vertical widths are reached between the bottom edge and two of the top horizontal edges of the polygon.

Figure 9:
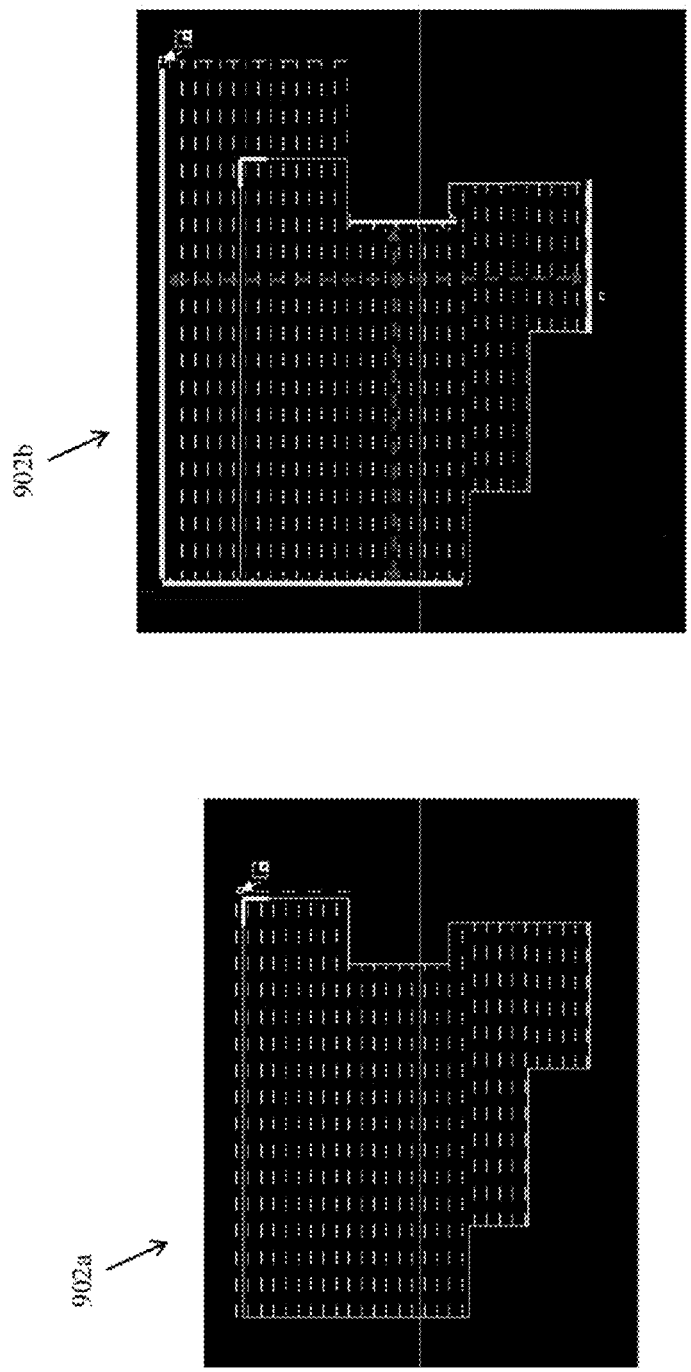
FIG. 9 illustrates polygons that are created/stretched in multiple directions.

As illustrated in FIG. 9, polygons may also be created/stretched in multiple directions using the invention. The left portion at 902a shows a polygon being stretched both horizontally and vertically in an upper right direction. The right portion at 902b shows the effect that takes place as legal vertical and/or horizontal widths are reached between two parallel horizontal edges and/or between two parallel vertical edges of the polygon.

Figure 10:
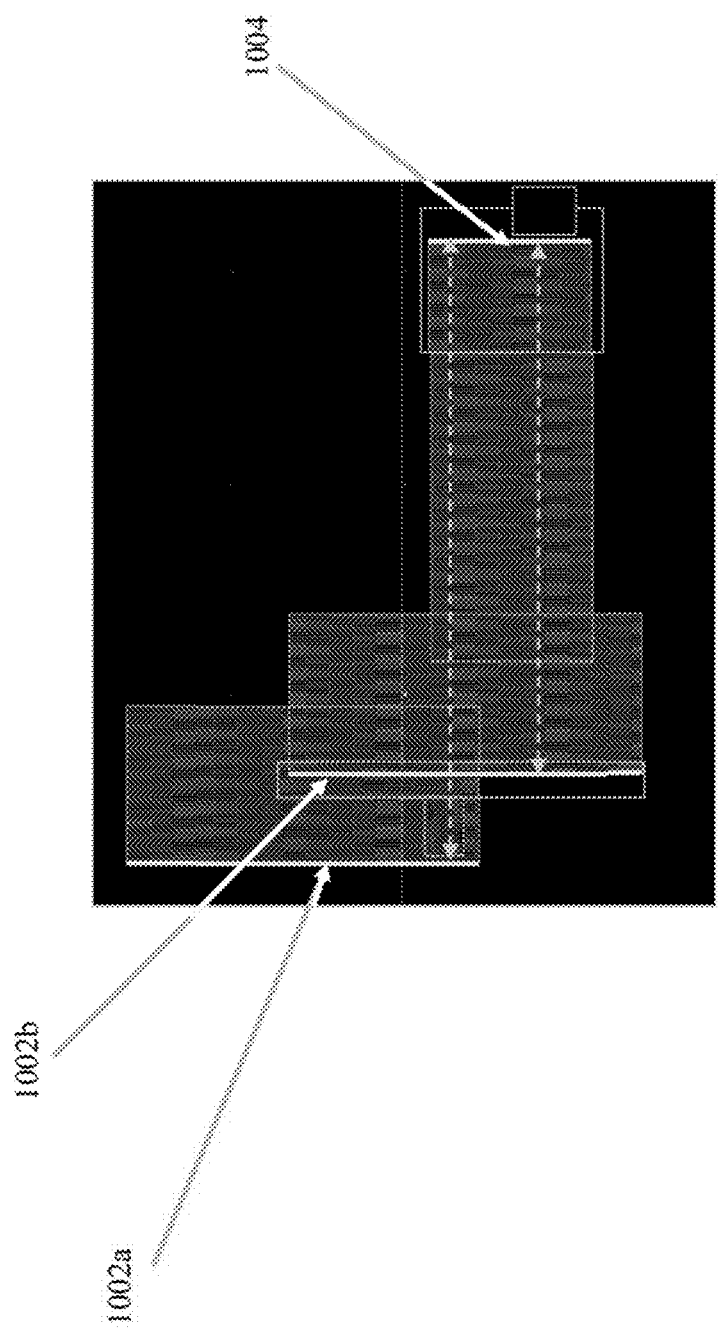
FIG. 10 provides an illustration of creating/editing an island.
Figure 11:
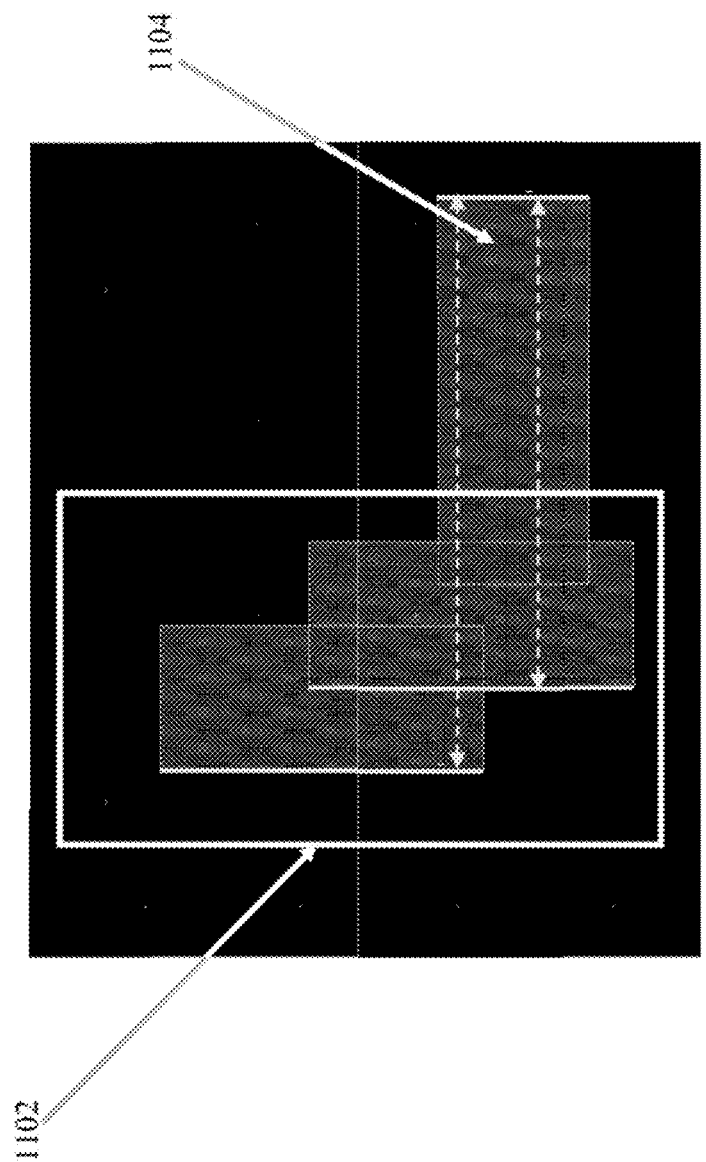
FIG. 11 shows an example of a hierarchical island in a layout.

The invention is also applicable to islands in the layout. Islands are formed when two or more shapes on the same layer overlap or abut. FIG. 10 provides an illustration of an island. For this example, it is assumed that a horizontal allowed width range constraint was defined for the layer in the technology file. In operation, as one of the edges 1004 of the island is being stretched, if its distance with a another parallel edge belonging to the island (e.g., edges 1002a or 1002b parallel to the edge 1004 being stretched) gets close (e.g., within the aperture) to any of the legal width values specified in the constraint, then highlights will be shown, and the gravity effect will take place. In some embodiments, this capability is limited to the creation and stretching of a flat shape (rectangle, polygon) belonging to an island, but not when "moving" a shape belonging to an island The inventive approach can also be applied to hierarchical islands. A hierarchical island is formed when two or more) shapes on the same layer and belonging to different levels of hierarchy overlap or abut. FIG. 11 shows an example of a hierarchical island in a layout. In this example, one top level shape 1104 is being created or stretched at the top level. The shape overlaps with two shapes on the same layer belonging to a cell 1104 (e.g., located below the current hierarchy). The gravity effect will behave the same way as described in the previous description.

Figure 12:
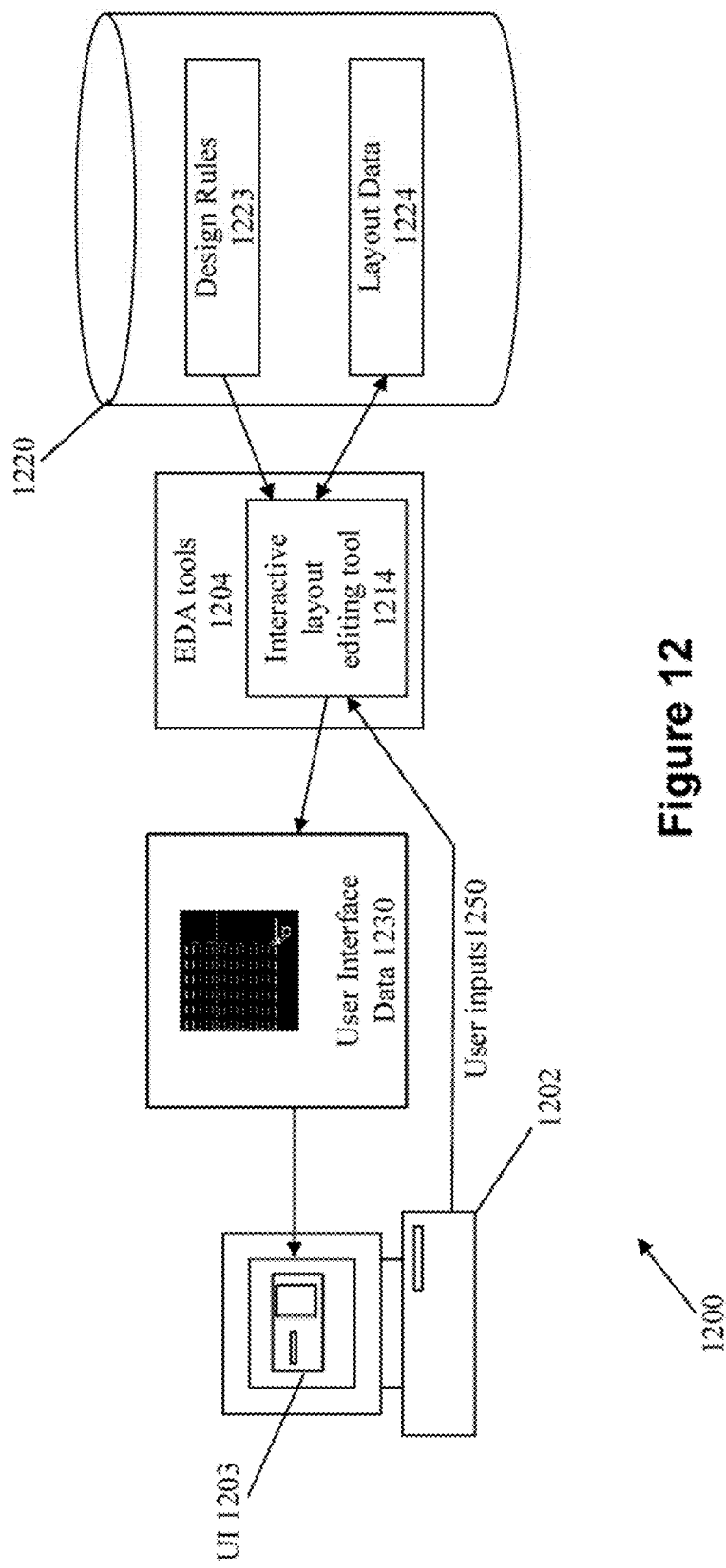
FIG. 12 illustrates an example system which may be employed in some embodiments of the invention to implement/edit a design layout.

FIG. 12 illustrates an example system 1200 which may be employed in some embodiments of the invention to implement/edit a design layout. System 1200 includes one or more users at one or more user stations 1202 that operate the system 1200 to design or edit electronic designs. Such users include, for example, design engineers or verification engineers. User station 1202 comprises any type of computing station that may be used to operate, interface with, or implement EDA applications or devices. Examples of such user stations 1202 include for example, workstations, personal computers, or remote computing terminals. User station 1202 comprises a display device, such as a display monitor, for displaying electronic design layouts and processing results to users at the user station 1202. User station 1202 also comprises one or more input devices for the user to provide operational control over the activities of system 1200, such as a mouse or keyboard to manipulate a pointing object in a graphical user interface to generate user inputs 1250.

The electronic designs may be stored in a computer readable storage device 1220. Computer readable storage device 1220 comprises any combination of hardware and software that allows for ready access to the data that is located at the computer readable storage device 1220. For example, computer readable storage device 1220 could be implemented as computer memory operatively managed by an operating system. The computer readable storage device 1220 could also be implemented as an electronic database system having storage on persistent and/or non-persistent storage.

One or more computer aided design (CAD) tools or electronic design automation (EDA) tools 1204, such as a layout tool, place & route tool, and/or interactive layout editing tool 1214, may be used by users at a user station 1202 to create or edit the layout 1224 of an electronic design. The tool 1214 may create, edit, visualize, and/or verify layout 1224 with consideration of design rules 1223. According to the present embodiment, the computer readable storage device 1220 may be utilized to hold the electronic design rules 1223 and the layout data 1224.

As discussed above, the tool 1214 provides for functionality to provide visualization of legal locations of edges and dimensions for an object being placed or edited in the layout. During interactive editing of the design process, visual indicators may be provided to the user to indicate the legal locations at which edges of an object may be placed in the layout. Snapping may be provided automatically snap the edges to the legal locations. User interface data 1230 is generated to be displayed within a user interface 1203 on the user station 1202. The user interface data 1230 will display the shapes and polygons, and will also include a visual depiction of legal locations of the objects in the layout.

Therefore, what has been disclosed above is an improved method and system for visualizing legal locations of edges and dimensions for an object being placed or edited in the layout. During the design process, visual indicators may be provided to the user to indicate the legal locations at which edges of an object may be placed in the layout. Snapping may be provided automatically snap the edges to the legal locations. However, the user can control whether and under what circumstances the gravitation and/or snapping will occur.

In this way, the designer does not need to manually place the edges of every single object, which is especially helpful for objects that are intended to have an edge at a legal location. Upon a design choice by the designer, the objects can be edited so that an edge does not need to immediately comply with a design rule.

System Architecture Overview

Figure 13:
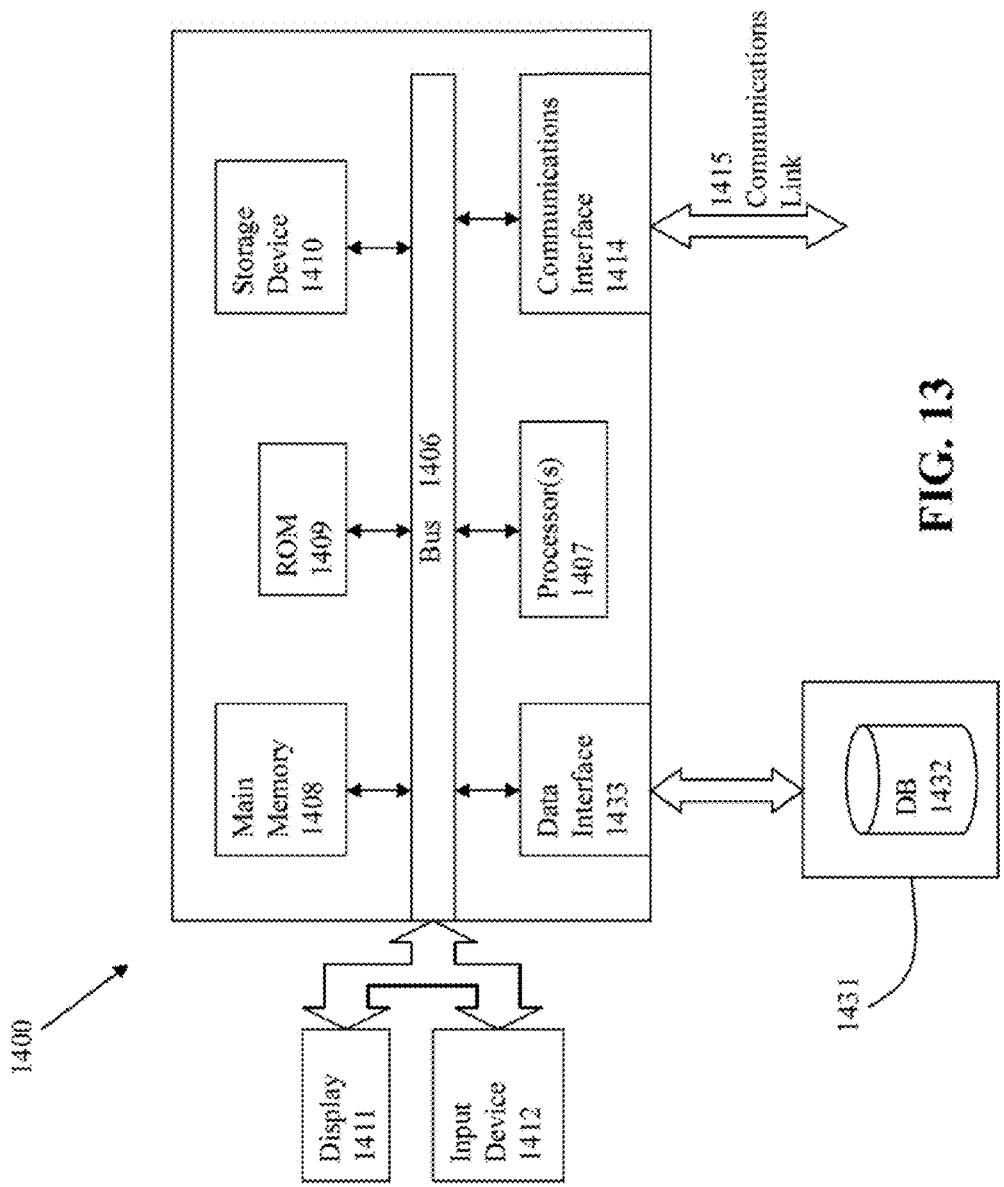
FIG. 13 shows an architecture of an example computing system with which the invention may be implemented.

FIG. 13 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another. Data may be accessed on a database 1432 on a storage device 1432 through a data interface 1433.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method implemented with a processor, the method comprising:
    receiving instructions to create or edit an object on an electronic design layout;
    tracking a user input to configure the object;

calculating effects of one or more design rules relative to the user input with an interactive layout editing mechanism that includes a processor and calculates the effects to configure the object;

displaying a visual indicator of a valid object configuration while affixing a location of an on-screen indicator for the user input when the on-screen indicator is being moved according to the user input, wherein the visual indicator includes a ghosted image of at least a portion of the object when at least a part of the object falls within an aperture range; and controllably permitting either an invalid object configuration or automatic implementation of the valid object configuration.

2. The method of claim 1, in which the automatic implementation of the valid object configuration is performed by snapping an edge to a valid location, and the aperture range include a distance from at least the on-screen indicator to the valid object configuration when the valid object configuration exhibits gravitational effects.

3. The method of claim 1, in which the visual indicator of the valid object configuration comprises the ghosted image corresponding to the valid object configuration while a position of a cursor falls within the aperture range.

4. The method of claim 3, wherein the ghosted image corresponding to the valid object configuration is displayed without showing motion of the cursor.

5. The method of claim 3, in which the ghosted image is not displayed when the cursor position falls outside the aperture range.

6. The method of claim 1, in which the one or more design rules comprise an allowable width range constraint.

7. The method of claim 1, wherein the aperture range is configured to be at or smaller than ½ of an allowable distance or range constraint.

8. The method of claim 1, in which analysis and visual indicator are provided in a horizontal direction, a vertical direction, or a combination of the horizontal direction and the vertical direction.

9. The method of claim 1, wherein the object comprises at least one of a rectangle, polygon, or island.

10. The method of claim 1, wherein the object comprises a hierarchical object.

11. A computer program product embodied on a non-transitory computer usable medium, the non-transitory computer readable medium having stored thereon a sequence of instructions which, when executed by a processor causes the processor to execute a method, the method comprising:

receiving instructions to create or edit an object on an electronic design layout;

tracking user input to configure the object;

calculating effects of one or more design rules relative to the user input with an interactive layout editing mechanism that includes a processor and calculates the effects to configure the object;

displaying a visual indicator of a valid object configuration while affixing a location of an on-screen indicator for the user input when the on-screen indicator is being moved according to the user input, wherein the visual indicator includes a ghosted image of at least a portion of the object when at least a part of the object falls within an aperture range; and controllably permitting either an invalid object configuration or automatic implementation of the valid object configuration.

12. The computer program product of claim 11, in which the automatic implementation of the valid object configuration is performed by snapping an edge to a valid location, and the aperture range include a distance from at least the on-screen indicator to the valid object configuration when the valid object configuration exhibits gravitational effects.

13. The computer program product of claim 11, in which the visual indicator of the valid object configuration comprises the ghosted image corresponding to the valid object configuration while a position of a cursor falls within the aperture range.

14. The computer program product of claim 13, wherein the ghosted image corresponding to the valid object configuration is displayed without showing motion of the cursor.

15. The computer program product of claim 13, in which the ghosted image is not displayed when the cursor position falls outside the aperture range.

16. The computer program product of claim 11, in which the one or more design rules comprise an allowable width range constraint.

17. The computer program product of claim 11, wherein the aperture range is configured to be at or smaller than ½ of an allowable distance or range constraint.

18. The computer program product of claim 11, in which analysis and visual indicator are provided in a horizontal direction, a vertical direction, or a combination of the horizontal direction and the vertical direction.

19. The computer program product of claim 11, wherein the object comprises at least one of a rectangle, polygon, or island.

20. The computer program product of claim 11, wherein the object comprises a hierarchical object.

21. A system, comprising:

an interactive layout editing mechanism including a processor; and a memory for holding programmable code, wherein the programmable code includes instructions which, when executed by the interactive layout editing mechanism, cause the interactive layout editing mechanism to receive instructions to create or edit an object on an electronic design layout, track a user input to configure the object, calculate effects of one or more design rules relative to the user input with the interactive layout editing mechanism that calculates the effects to configure the object, display a visual indicator of a valid object configuration while affixing a location of an on-screen indicator for the user input when the on-screen indicator is moved according to the user input, wherein the visual indicator includes a ghosted image of at least a portion of the object when at least a part of the object falls within an aperture range, and controllably permit either an invalid object configuration or automatic implementation of the valid object configuration.

22. The system of claim 21, in which the automatic implementation of the valid object configuration is performed by snapping an edge to a valid location, and the aperture range include a distance from at least the on-screen indicator to the valid object configuration when the valid object configuration exhibits gravitational effects.

23. The system of claim 21, in which the visual indicator of the valid object configuration comprises the ghosted image corresponding to the valid object configuration while a position of a cursor falls within the aperture range.

24. The system of claim 23, wherein the ghosted image corresponding to the valid object configuration is displayed without showing motion of the cursor.

25. The system of claim 23, in which the ghosted image is not displayed when the cursor position falls outside the aperture range.

26. The system of claim 21, in which the one or more design rules comprise an allowable width range constraint.

27. The system of claim 21, wherein the aperture range is configured to be at or smaller than ½ of an allowable distance or range constraint.

28. The system of claim 21, in which analysis and visual indicator are provided in a horizontal direction, a vertical direction, or a combination of the horizontal direction and the vertical direction.

29. The system of claim 21, wherein the object comprises at least one of a rectangle, polygon, or island.

30. The system of claim 21, wherein the object comprises a hierarchical object.

* * * * *